United States Patent [19]

Wu

[11] Patent Number: 5,929,493
[45] Date of Patent: Jul. 27, 1999

[54] CMOS TRANSISTORS WITH SELF-ALIGNED PLANARIZATION TWIN-WELL BY USING FEWER MASK COUNTS

[75] Inventor: Shye-Lin Wu, Hsinchu, Taiwan

[73] Assignee: Texas Instruments—Acer Incorporated, Hsinchu, Taiwan

[21] Appl. No.: 09/052,280

[22] Filed: Mar. 31, 1998

[51] Int. Cl.$^6$ .............................. H01L 29/76; H01L 29/94
[52] U.S. Cl. .................. 257/369; 257/351; 257/338; 438/228
[58] Field of Search .................................. 257/351, 369, 257/371, 327, 338; 438/199, 217, 228

[56] References Cited

U.S. PATENT DOCUMENTS

| | | | |
|---|---|---|---|
| 4,906,588 | 3/1990 | Harrington, III | 438/282 |
| 5,164,801 | 11/1992 | Hieda et al. | 257/344 |
| 5,278,441 | 1/1994 | Kang et al. | 257/371 |
| 5,329,138 | 7/1994 | Mitani et al. | 257/42 |
| 5,576,570 | 11/1996 | Ohsawa et al. | 257/369 |
| 5,606,191 | 2/1997 | Wang | 257/336 |

OTHER PUBLICATIONS

Silicon Processing for the VLSI Era vol. 2—Process Integration, S. Wolf, pp. 389–397, 1990.

*Primary Examiner*—Valencia Martin-Wallace
*Assistant Examiner*—George C. Eckert, II
*Attorney, Agent, or Firm*—Harness, Dickey & Pierce, P.L.C.

[57] ABSTRACT

The present invention discloses a structure for forming CMOS transistors with a self-aligned planarization twin-well by using fewer mask counts. An N-well is formed in the semiconductor substrate. Then, a P-well is formed against the N-well, and portion of the P-well is formed along the bottom of the N-well. An oxide region is formed on the surface of both the N- and P-wells, and covers portions of the N- and P-wells. A high energy and low dose boron blanket implantation is performed to increase the threshold voltage of the oxide region, which has been used for an ESD (Electro-Static Discharge) protection circuit. Punch-through stopping layers for the CMOS transistor are formed in the upper portion of the N-well. A $BF_2$ ion implantation layer is formed at the top of both the N- and P-wells to increase the threshold voltages of the PMOSFET and NMOSFET transistors. A pad oxide layer is also formed to cover the top of the N- and P-wells, and portions of the pad oxide layer are then formed to be the gate oxide layer of the PMOSFET and NMOSFET transistors.

7 Claims, 5 Drawing Sheets

CMOS TRANSISTORS WITH SELF-ALIGNED PLANARIZATION TWIN-WELL BY USING FEWER MASK COUNTS

BACKGROUND OF THE INVENTION

1. Field of the Invention

The present invention relates to CMOS (Complementary Metal-Oxide-Semiconductor) transistors and, more particularly, to the structure of the CMOS transistors with planarization twin-wells that are formed by using fewer mask counts than is conventional.

2. Description of the Prior Art

The CMOS transistors draw very little current during the transition from one state to another, and allow power consumption to be minimized. This advantage is an important attribute for high-density applications.

Typically, there are many technologies used to fabricate the CMOS transistors, such as P-well, N-well, and twin-well processes. The twin-well process is the most attractive scheme utilized for fabricating CMOS products because of the many advantages offered by the twin-well technology. The twin-well technology fabricates two separate twins to be implemented into very lightly doped silicon. This also allows the doping profiles in each twin region to be tailored independently so that neither type of device will suffer from excessive doping effects. Furthermore, the doping profile of each of the device types can be set independently since the constraint of single-well CMOS does not exist.

Unfortunately, it is difficult to obtain a true planarized self-aligned twin-well for CMOS transistors because the twin boundary has a topography height, which usually varies from 100 to 200 nm (nanometers). Under this situation with such a topography height, the current I-line lithography tools encounter severe difficulties when printing transistors with dimension below 0.35 µm. Accordingly, this disadvantage becomes a bottleneck especially for deep sub-micro ULSI (Ultra-Large-Scale-Integrated) applications that are the main electronic products today (please refer to "0.2-µm n-Channel and p-Channel MOSFET's Integrated on Oxidation-Planarized Twin-Tubs" in IEEE Electron Device Lett., vol., EDL-11, p. 500–502, 1996). Also, for gate runners parallel to the topography edges, ragged lines are formed due to proximity effects in the resist exposure. Therefore, for the lithography of deep sub-micro window contact that contains more topography from the gate runners, the variation becomes even more extreme. A requirement has been arisen to disclose a structure for overcoming the aforementioned disadvantages while the CMOS transistors are fabricated.

SUMMARY OF THE INVENTION

Accordingly, the present invention discloses a method of preparing a planarized self-aligned twin-well structure for CMOS transistors.

An N-well is formed in the semiconductor substrate, then a P-well is formed against the N-well, and a portion of the P-well is formed along the bottom of the N-well. An oxide region is formed on the surface of both the N- and P-wells, and covers portions of the N- and P-wells. A high energy and low dose boron blanket implantation is performed to increase the threshold voltage of the oxide region, which has been used for an ESD (Electro-Static Discharge) protection circuit. Punch-through stopping layers for the CMOS transistor are formed in the upper portion of the N-well. A pad oxide layer is also formed to cover the top of the N- and P-wells, and portions of the pad oxide layer are formed to be the gate oxide of the PMOSFET and NMOSFET transistors.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 13:
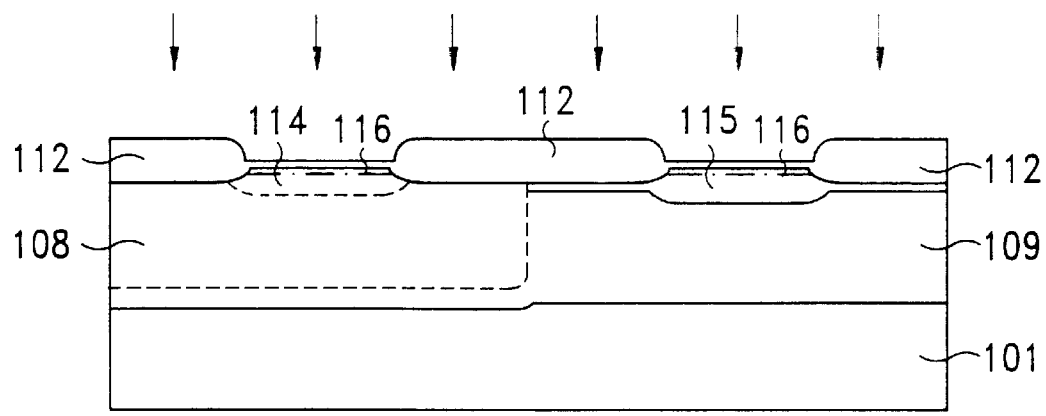
FIG. 13 shows a cross-section representative of when a low energy and low $BF_2$ ion implantation is performed to the semiconductor substrate.

The whole structure on the semiconductor substrate 101 shown in FIG. 13 is a planar twin-well structure for fabricating CMOS transistors. An N-well 108 is formed in the semiconductor substrate 101, then a P-well 109 is formed against the N-well 108, and a portion of the P-well 109 is formed along the bottom of the N-well 108. A field oxide layer 112 is formed on the surface of both the N-well 108 and P-well 109, and covers portions of the N-well 108 and P-well 109. A high energy and low dose boron blanket implantation is performed to increase the threshold voltage of the field oxide layer 112, which has been used for an ESD (Electro-Static Discharge) protection circuit. An N-type punch-through stopping layer 114 for the CMOS transistor is formed in the upper portion of the N-well 108. A P-type through stopping layer 115 is formed in the upper portion of the P-well 109. A $BF_2$ ion implantation layer 116 is formed at the top of both the N-well 108 and P-well 109 to increase the threshold voltages of the PMOSFET and NMOSFET transistors. A pad oxide layer is also formed to cover the top of the N-well 108 and P-well 109, and portions of the pad oxide layer are then formed to be the gate oxide layers of the PMOSFET and NMOSFET transistors.

Figure 1:
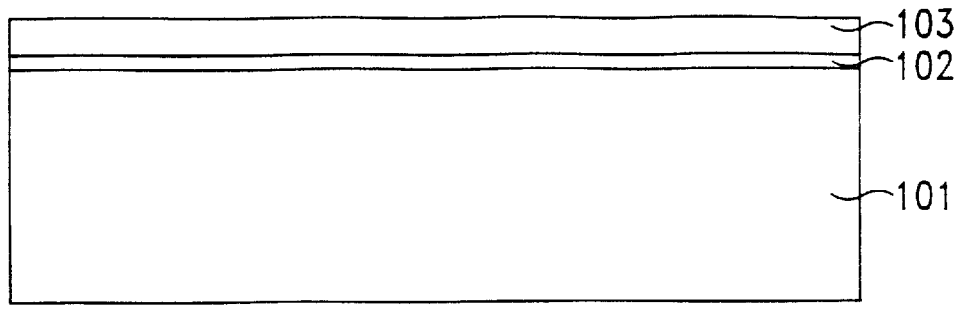
FIG. 1 is a cross-section of a semiconductor substrate representative of when a silicon nitride layer is formed over a pad oxide layer on the semiconductor substrate.
Figure 2:
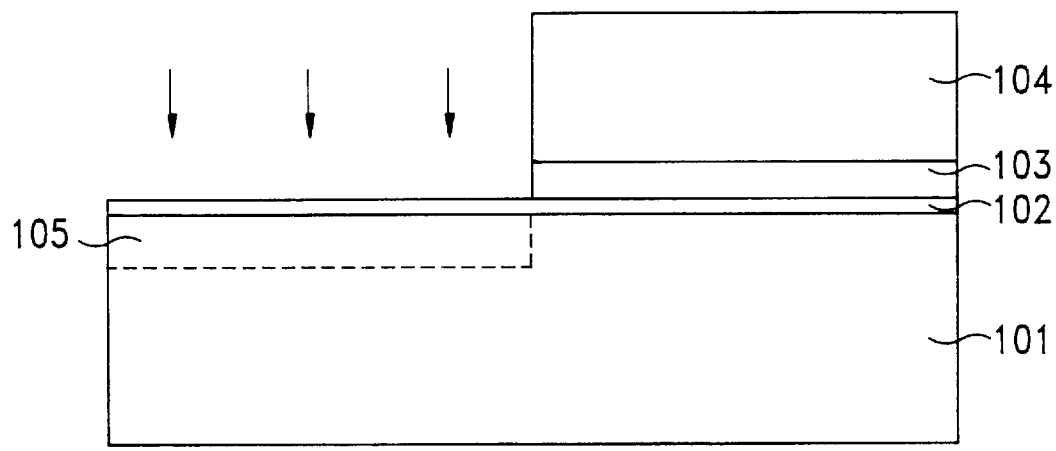
FIG. 2 illustrates a cross-sectional view of the semiconductor substrate representative of when phosphorous ions are implanted to define an N-well region in the semiconductor substrate.

The formation of the present invention can be seen hereinafter. FIG. 1 is a cross section of a semiconductor substrate 101 representative of when a silicon nitride layer 103 with a thickness of about 500 to 3000 Å (angstrom) is formed over a pad oxide layer 102. The pad oxide layer 102 is composed of silicon dioxide with a thickness of about 30 to 500 Å. The silicon nitride layer 103 is then patterned to define an N-well region. Next, a high energy ion implantation is performed to form the N-well region 105 by using a photoresist layer 104 as a mask. The source of the ion implementation is N- (conductive) type ions, such as phosphorous or the like. FIG. 2 illustrates a cross-sectional view representative of when phosphorous ions are implanted to form the N-well region 105 in the semiconductor substrate 101. The depth of the N-well 105 is about 0.1 to 1 $\mu$m, and the implanted phosphorous ions are at an energy about 100 KeV to 3.0 MeV, and at a dose between 5E11 to 5E13 atoms/$cm^2$.

Figure 3:
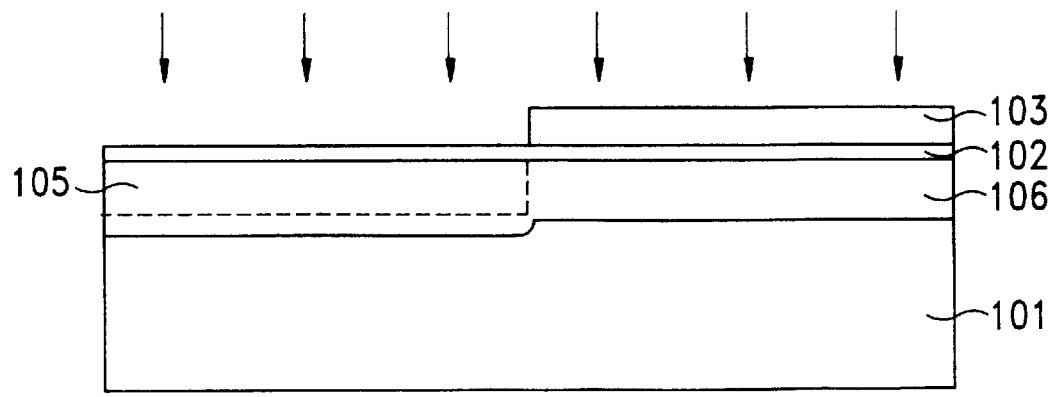
FIG. 3 represents a cross-section illustrative of when a high energy and low dose blanket boron is implanted in a semiconductor substrate when the photoresist layer used for defining the N-well is stripped.
Figure 4:
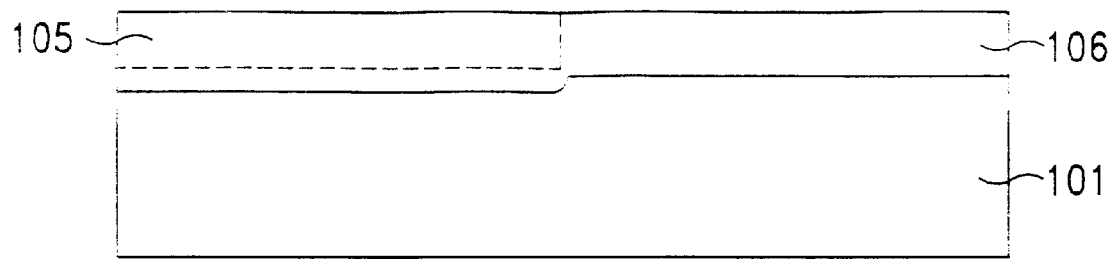
FIG. 4 demonstrates a cross section of the semiconductor substrate when the silicon nitride layer and the pad oxide layer are completely removed.

After the photoresist 104 is stripped, a high energy and low dose blanket implantation is performed to form a doped region 106 against the N-well region 105. Typically, the doped region 106 is formed by implanting P-type ions such as boron or the like. FIG. 3 illustrates a cross-sectional view of the semiconductor substrate 101 after the doped region 106 is formed. The doped boron ions are at an energy about 100 KeV to 3.0 MeV, and at a dose between 5E11 to 5E13 atoms/$cm^2$. The silicon nitride layer 103 and the pad oxide layer 102 are then removed, and the cross section of the semiconductor substrate 101 when the nitride layer 103 and the pad oxide layer 102 are completely removed is demonstrated in FIG. 4.

Figure 5:
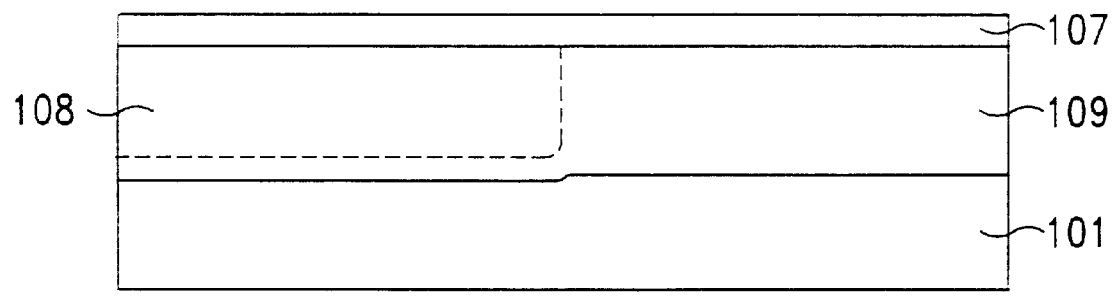
FIG. 5 shows a cross-sectional view of the semiconductor substrate when a high temperature wet oxidation is performed to remove crystalline defects and then in-situ anneal.
Figure 6:
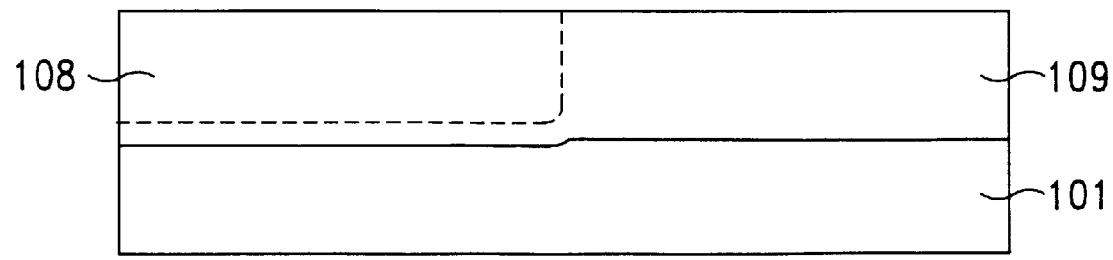
FIG. 6 is a cross-sectional view after a thick pad oxide layer formed by the high temperature oxidation is completely removed.

Referring to FIG. 5, a cross section illustrative of when a high temperature steam oxidation is performed to eliminate surface crystalline defects is shown. Furthermore, the in-situ high temperature anneal is performed long enough to form a deep twin-well encompassing an, N-well 108 and a P-well 109. An oxide layer 107 with a thickness of about 500 to 5000 Å is also grown on the surface of the semiconductor substrate 101 due to the oxidation. The thick pad oxide layer 107 grown by the oxidation is then removed, and the cross section of the semiconductor substrate 101 after the thick pad oxide layer 107 is removed as described in FIG. 6. Next, the standard processes for defining active regions can be continued.

Figure 7:
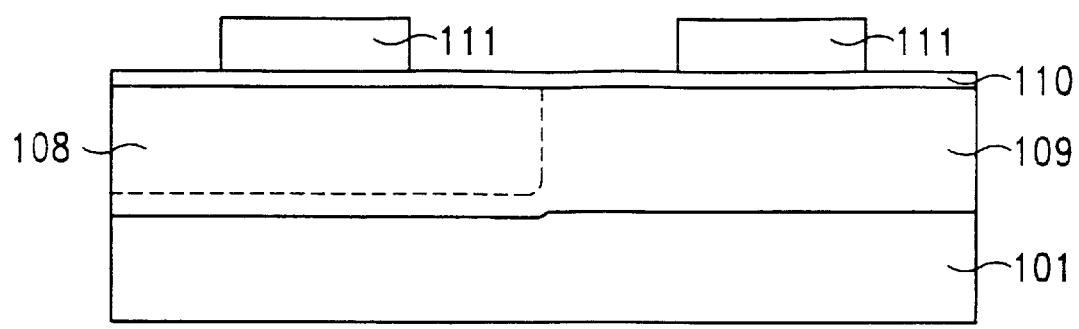
FIG. 7 shows a cross- section illustrative of when a second silicon nitride layer is patterned over a second pad oxide layer on the semiconductor substrate.
Figure 8:
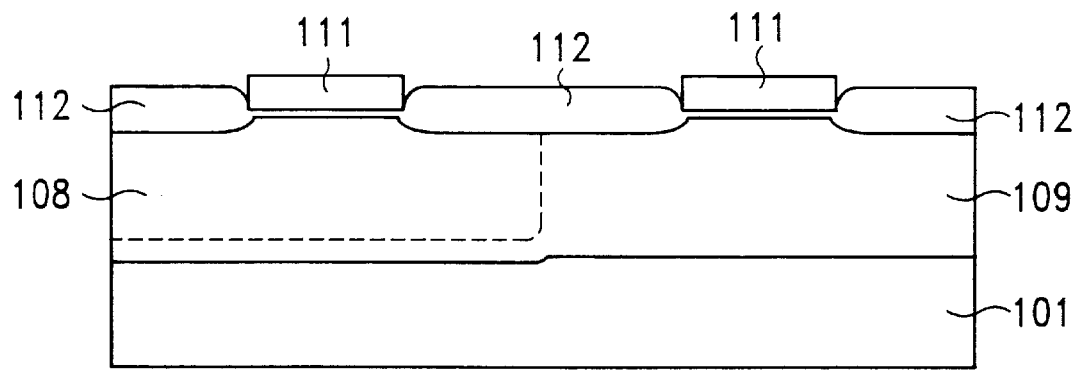
FIG. 8 depicts a cross-section of the semiconductor substrate after a thermal oxidation is applied to grow a field oxide layer on the semiconductor substrate.
Figure 9:
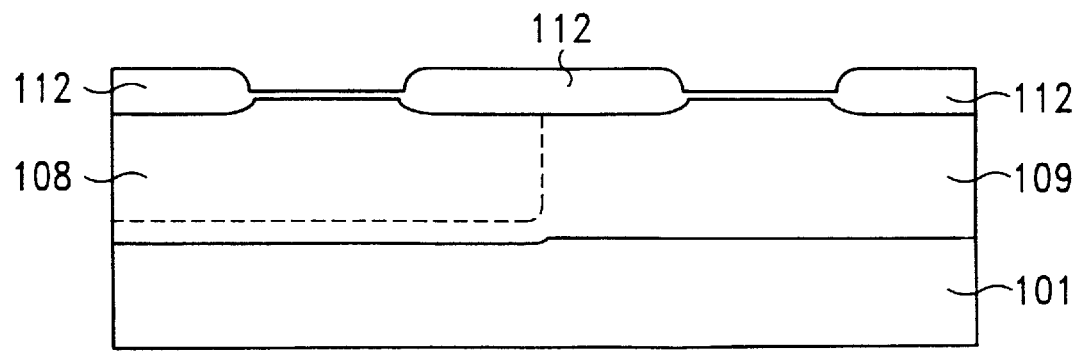
FIG. 9 represents a cross-sectional view after the second nitride layer is completely removed.

Referring to FIG. 7, a cross section illustrative of when a second silicon nitride layer 111 is patterned over a second pad oxide layer 110 on the semiconductor substrate 101 to define the active regions is shown. FIG. 8 depicts a cross-section of the semiconductor substrate 101 after a thermal oxidation is applied to grow a field oxide region 112 on the semiconductor substrate 101. And FIG. 9 represents a cross-section view after the second nitride layer 111 is completely removed.

Figure 10:
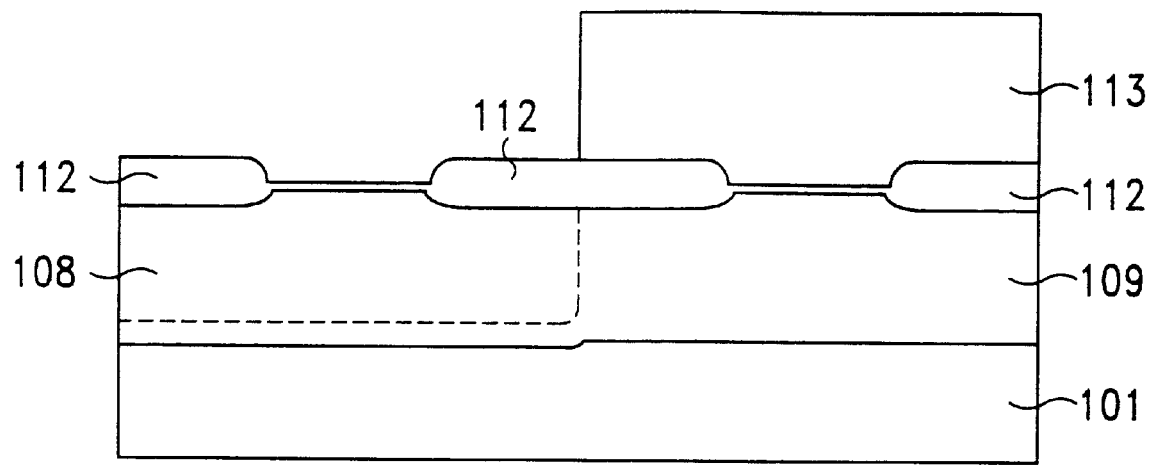
FIG. 10 illustrates a cross-sectional view after a second photoresist layer is patterned on the semiconductor substrate.
Figure 11:
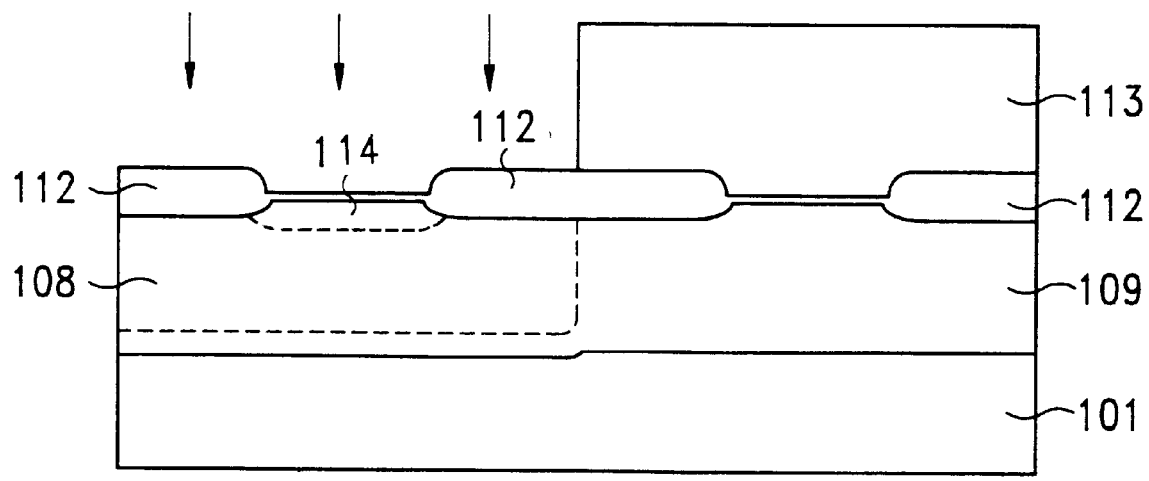
FIG. 11 displays a cross-sectional view as a phosphorous punch-through stopping implantation is performed by using implanting a second high energy and low dose blanket boron in a semiconductor substrate by the second photoresist layer as a mask.
Figure 12:
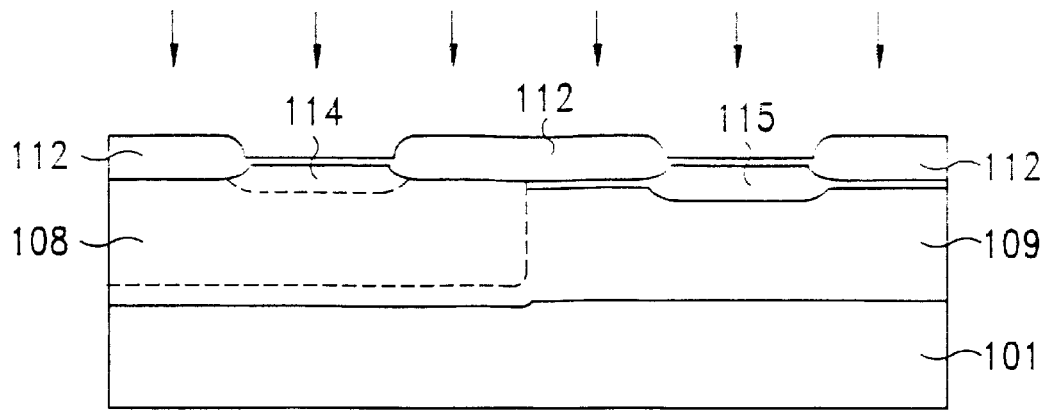
FIG. 12 demonstrates a cross-section of the semiconductor substrate after a third high energy and low dose boron blanket implantation is performed in the semiconductor substrate.
Figure 14:
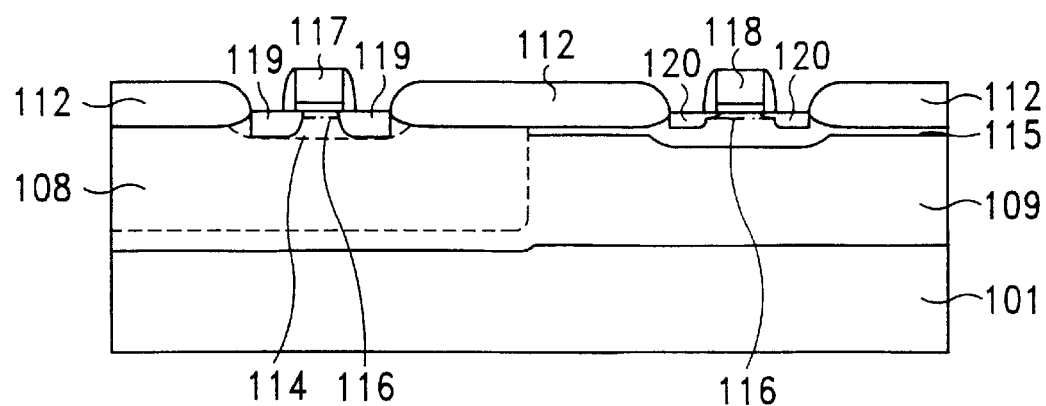
FIG. 14 is a cross-section of the semiconductor substrate when a CMOS transistor is fabricated on the semiconductor substrate.

With reference to FIG. 10, a cross-section view when a second photoresist layer 113 is patterned on the semiconductor substrate 101 to expose the N-well 108 is shown. Then, and with reference to FIG. 11, a punch-through stopping layer 114 for the PMOSFET is formed in the upper portion of the N-well 108. (A similar punch-through stopping layer 115 is formed in the upper portion of the P-well 109 as shown in FIGS. 12, 13 and 14. Typically, the punch-through stopping layer is formed by implanting a high energy and low dose blanket phosphorous and is accompanied by the second photoresist layer 113 as a mask. The implanted phosphorous ions are at an energy of about 100 to 300 KeV, and at a dose between 5E11 to 5E13 atoms/$cm^2$. FIG. 11 displays a cross-sectional view when the punch-through stopping layer 114 is formed.

According to the next step, a high energy and low dose boron blanket implantation is applied to form the optimal impurity profiles and thus to increase the threshold voltage of the NMOSFET. The high energy and low dose boron blanket implementation can also increase the threshold voltage of the field oxide device, which has been used for the ESD (Electro-Static Discharge) protection circuit. Thus, this action can improve the ESD performance (refer to the article titled "Degradation of I/O Device due to ESD-Induced Dislocations" disclosed by Hashimoto et al.). FIG. 12 demonstrates a cross-section of the semiconductor substrate 101 when a high energy and low dose boron blanket implantation is performed after the second photoresist layer 113 is removed. The P-type punch-through stopping layer 115 is formed in the upper portion of the P-well 109 as illustrated in FIGS. 12, 13, and 14. The implanted boron ions are at an energy of about 100 to 300 KeV, and at a dose between 1E11 to 1E13 atoms/$cm^2$.

Finally, preparation of a planarized twin-well for CMOS transistor after a low energy and low dose $BF_2$ ion implantation is performed for adjusting the threshold voltages of both the NMOSFET and PMOSFET. FIG. 13 shows a cross-section representative of when the low energy and low $BF_2$ ion implantation is performed to form an adjusting layer 116 that adjusts the threshold voltage of the CMOS transistors. The implanted $BF_2$ ions are at an energy of about 10 to 150 KeV, and at a dose between 1E12 to 1E14 atoms/$cm^2$.

It is obvious that a planarized topography between N- and P-wells can be easily obtained. In addition, there are fewer masks required in the invention when compared with conventional CMOS technology because those masks used for P-well implant, channel stop implant, P-Vt (threshold voltage of PMOS) and N-Vt (threshold voltage of NMOS) implants can be eliminated. Moreover, the traditional recipe is manufacturable for the present invention.

When the isolation regions are completely made for semiconductor devices, sequence processes for fabricating CMOS transistors are thus continued. For example, FIG. 14 shows a cross-section illustrative of such further sequences and illustrate a gate structure 117, and source and drain 119 for the PMOSFET, and forming a gate structure 118, and source and drain 120 for the NMOSFET.

As is understood by a person skilled in the art, the foregoing preferred embodiments of the present invention are illustrative of the present invention rather than limiting of the present invention. The description is intended to cover various modifications and similar arrangements included within the spirit and scope of the appended claims, the scope of which should be accorded the broadest interpretation so as to encompass all such modifications and similar structure.

What is claimed is:

1. A structure of a twin-well CMOS (Complementary Metal-Oxide-Semiconductor) transistor with reducing masks, said CMOS comprising a PMOS and an NMOS, said structure comprising:

an N-well region formed in a semiconductor substrate;

a P-well region formed adjacent said N-well region, a portion of said P-well region being formed at the bottom of said N-well region;

an oxide layer formed on surfaces of said N-well region and said P-well region, said oxide layer covering portions of said N-well region and said P-well region, a boron blanket implantation being performed in said oxide layer for increasing a threshold voltage of said oxide region;

a P-type punch-through stopping layer formed in an upper portion of said N-well region, said P-type punch-through stopping layer being used to prevent electrical coupling between a first electrode of said PMOS in said N-well and a second electrode of said NMOS in said P-well;

an N-type punch-through stopping layer formed in an upper portion of said P-well region, said N-type punch-through stopping layer being used to prevent electrical coupling between a third electrode of said PMOS in said N-well and a fourth electrode of said NMOS in said P-well;

a P-type threshold voltage adjusting layer formed at a top of said P-type punch-through stopping layer;

an N-type threshold voltage adjusting layer formed at said top of said N-type punch-through stopping layer; and a pad oxide layer formed to cover a top of said N-well region and said P-well region.

2. The structure according to claim 1, wherein said N-well region is formed by implementing phosphorous ions.

3. The structure according to claim 1, wherein said phosphorous ions are implemented to a depth of about 0.1 to 1.0 μm.

4. The structure according to claim 1, wherein said P-well region is formed by implementing boron ions.

5. The structure according to claim 1, wherein said oxide layer is used as a field oxide layer between said CMOS transistors.

6. The structure according to claim 1, wherein a portion of said pad oxide layer is formed as a gate oxide layer of said CMOS transistors.

7. A structure of a twin-well CMOS (Complementary Metal-Oxide-Semiconductor) transistor with reducing masks, said CMOS comprising a PMOS and an NMOS, said structure comprising:

an N-well region formed in a semiconductor substrate;

a P-well region formed adjacent said N-well region;

an oxide layer formed on surfaces of said N-well region and said P-well region, said oxide layer covering portions of said N-well region and said P-well region;

a P-type punch-through stopping layer formed in an upper portion of said N-well region, said P-type punch-through stopping layer being an insulating layer to prevent electrical coupling between a first electrode of said PMOS in said N-well and a second electrode of said NMOS in said P-well;

an N-type punch-through stopping layer formed in an upper portion of said P-well region, said N-type punch-through stopping layer being an insulating layer to prevent electrical coupling between a third electrode of said PMOS in said N-well and a fourth electrode of said NMOS in said P-well;

a P-type threshold voltage adjusting layer formed in operative relation to said P-type punch-through stopping layer;

an N-type threshold voltage adjusting layer formed in operative relation to said N-type punch-through stopping layer; and a pad oxide layer formed to cover a top of said N-well region and said P-well region.

* * * * *